United States Patent
Lee et al.

(10) Patent No.: US 12,322,766 B2
(45) Date of Patent: Jun. 3, 2025

(54) BATTERY MANAGEMENT SYSTEM, BATTERY PACK, ELECTRIC VEHICLE AND BATTERY MANAGEMENT METHOD

(71) Applicant: LG ENERGY SOLUTION, LTD., Seoul (KR)

(72) Inventors: Ji-Eun Lee, Daejeon (KR); Young-Eun Choi, Daejeon (KR); Eun-Ju Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 198 days.

(21) Appl. No.: 18/029,862

(22) PCT Filed: Jul. 8, 2022

(86) PCT No.: PCT/KR2022/009998
§ 371 (c)(1),
(2) Date: Mar. 31, 2023

(87) PCT Pub. No.: WO2023/282713
PCT Pub. Date: Jan. 12, 2023

(65) Prior Publication Data
US 2023/0369660 A1    Nov. 16, 2023

(30) Foreign Application Priority Data

Jul. 8, 2021  (KR) .......................... 10-2021-0089983

(51) Int. Cl.
*H01M 10/42*   (2006.01)
*B60L 3/00*   (2019.01)
(Continued)

(52) U.S. Cl.
CPC ......... *H01M 10/425* (2013.01); *B60L 3/0046* (2013.01); *G01R 31/389* (2019.01);
(Continued)

(58) Field of Classification Search
CPC .... H01M 10/425; H01M 10/44; H01M 10/48; H01M 2010/4271; H01M 2220/20;
(Continued)

(56) References Cited

U.S. PATENT DOCUMENTS 9,356,325 B1    5/2016  Poirier
11,038,215 B2   6/2021  Nishida et al.
(Continued)

FOREIGN PATENT DOCUMENTS

EP    2 645 527 A1    10/2013
EP    3 373 383 A1     9/2018
(Continued)

OTHER PUBLICATIONS

Office Action dated May 21, 2024, issued in corresponding Japanese Patent Application No. 2023-520179.
(Continued)

*Primary Examiner* — Stephanie E Bloss
*Assistant Examiner* — Michael A Harrison
(74) *Attorney, Agent, or Firm* — Morgan, Lewis & Bockius LLP

(57) ABSTRACT

A battery management system according to the present disclosure includes a swelling detector including at least one sensor configured to detect a swelling status of a battery cell; and a control circuit configured to generate first time-series data of the swelling status repeatedly detected during a charging procedure included in a charge/discharge cycle of the battery cell. The control circuit is configured to determine a first change amount of the swelling status in the charging procedure from the first time-series data. The control circuit is configured to determine whether the battery cell is shorted internally based on the first change amount.

20 Claims, 7 Drawing Sheets

(51) Int. Cl.
*G01R 31/389* (2019.01)
*G01R 31/392* (2019.01)
*H01M 10/44* (2006.01)
*H01M 10/48* (2006.01)
*H02J 7/00* (2006.01)

(52) U.S. Cl.
CPC .......... *G01R 31/392* (2019.01); *H01M 10/44* (2013.01); *H01M 10/48* (2013.01); *H01M 2010/4271* (2013.01); *H01M 2220/20* (2013.01); *H02J 7/0047* (2013.01)

(58) Field of Classification Search
CPC ... G01R 31/389; G01R 31/392; B60L 3/0046; H02J 7/0047
See application file for complete search history.

(56) References Cited

U.S. PATENT DOCUMENTS

| | | |
|---|---|---|
| 2001/0019270 A1 | 9/2001 | Onishi et al. |
| 2011/0184677 A1 | 7/2011 | Tae et al. |
| 2017/0077561 A1 | 3/2017 | Fukuda et al. |
| 2017/0170668 A1 | 6/2017 | Hayashizaki et al. |
| 2019/0094003 A1 | 3/2019 | Kim et al. |
| 2020/0035082 A1* | 1/2020 | Lee .................. G08B 5/22 |
| 2020/0076011 A1 | 3/2020 | Choi et al. |
| 2020/0313152 A1* | 10/2020 | Stefanopoulou .... H01M 50/578 |
| 2021/0091574 A1 | 3/2021 | Sugiyama et al. |
| 2021/0167607 A1 | 6/2021 | Masuda et al. |
| 2021/0197691 A1 | 7/2021 | Stefanopoulou et al. |

FOREIGN PATENT DOCUMENTS

| | | |
|---|---|---|
| JP | 4666897 B2 | 4/2011 |
| JP | 2014-120335 A | 6/2014 |
| JP | 2016-027539 A | 2/2016 |
| JP | 5881593 B2 | 3/2016 |
| JP | 6361643 B2 | 7/2018 |
| JP | 6458578 B2 | 1/2019 |
| JP | 2020-71054 A | 5/2020 |
| JP | 2020-071962 A | 5/2020 |
| JP | 2021-15800 A | 2/2021 |
| KR | 10-1057547 B1 | 8/2011 |
| KR | 10-2018-0087040 A | 8/2018 |
| KR | 10-2018-0099668 A | 9/2018 |
| KR | 10-2018-0119472 A | 11/2018 |
| KR | 10-2020-0026416 A | 3/2020 |

OTHER PUBLICATIONS

The extended European Search Report (EESR) dated Apr. 9, 2024, issued in corresponding EP Patent Application No. 22838064.8.
International Search Report (with translation) and Written Opinion dated Oct. 20, 2022, for corresponding International Patent Application No. PCT/KR2022/009998.

* cited by examiner

BATTERY MANAGEMENT SYSTEM, BATTERY PACK, ELECTRIC VEHICLE AND BATTERY MANAGEMENT METHOD

TECHNICAL FIELD

The present application is a U.S. National Stage of PCT International Application No. PCT/KR2022/009998, filed Jul. 8, 2022, which claims the benefit of and priority to Korean Patent Application No. 10-2021-0089983 filed on Jul. 8, 2021, with the Korean Intellectual Property Office, the disclosure of which is incorporated herein by reference in its entirety.

The present disclosure relates to detection of an internal short circuit fault in a battery cell.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low, and the energy density is high.

To meet the high voltage and high capacity requirements of electric vehicle applications, battery modules including a plurality of battery cells connected in series are widely used.

In such a battery module, faults in some battery cells may be highly likely to have adverse impacts on the performance and safety of the entire battery system. Accordingly, in the management of the battery system, it is important to properly detect the faults in the individual battery cells.

Among various types of battery cell faults, an internal short circuit fault is a main fault that affects fires directly/indirectly. The internal short circuit fault is also referred to as a 'micro short', and is caused by side reactions (for example, deposition on the negative electrode surface) in the battery cells and/or infiltration of impurities into the battery cells.

Prior art detects the internal short circuit fault in each battery cell by comparing a reduction in Open Circuit Voltage (OCV) of the battery cell while in rest with a predetermined level or an average reduction of the other battery cells. However, since the OCV of the battery cell reduces very slowly while in rest, it takes a long time to detect the internal short circuit fault from the reduction in OCV.

DISCLOSURE

Technical Problem

The present disclosure is designed to solve the above-described problem, and therefore the present disclosure is directed to providing a battery management system, a battery pack and an electric vehicle and a battery management method for detecting an internal short circuit fault in a battery cell by analyzing a time-series data of a swelling status of the battery cell detected during a charge/discharge cycle based on a correlation between the swelling status of the battery cell and the internal short circuit fault.

These and other objectives and advantages of the present disclosure may be understood by the following description and will be apparent from an embodiment of the present disclosure. In addition, it will be readily understood that the objectives and advantages of the present disclosure may be realized by the means set forth in the appended claims and a combination thereof.

Technical Solution

A battery management system according to an aspect of the present disclosure includes a swelling detector including at least one sensor configured to detect a swelling status of a battery cell; and a control circuit configured to generate first time-series data of the swelling status repeatedly detected during a charging procedure included in a charge/discharge cycle of the battery cell. The control circuit is configured to determine a first change amount of the swelling status in the charging procedure from the first time-series data and to determine whether the battery cell is shorted internally based on the first change amount.

The swelling status is a thickness of the battery cell or a load acting on the battery cell.

The control circuit may be configured to determine, as the first change amount, a difference between a minimum swelling status and a maximum swelling status of the first time-series data or a difference between the swelling status detected at a point in time when a predetermined time passed from a start time of the charging procedure and the maximum swelling status of the first time-series data.

The control circuit may be configured to determine that the battery cell is shorted internally when the first change amount is equal to or larger than a first threshold change amount.

The control circuit may be configured to generate second time-series data of the swelling status repeatedly detected during a discharging procedure included in the charge/discharge cycle, the discharging procedure being performed after the charging procedure. The control circuit may be configured to determine a second change amount of the swelling status from the first time-series data and the second time-series data. The second change amount may be a difference between a minimum swelling status of the first time-series data and a minimum swelling status of the second time-series data. The control circuit may be configured to determine whether the battery cell is shorted internally based on the first change amount and the second change amount.

The control circuit may be configured to determine that the battery cell is shorted internally when the first change amount is equal to or larger than a first threshold change amount and the second change amount is equal to or larger than a second threshold change amount.

The battery management system may further include a current detector configured to detect a battery current flowing through the battery cell. The control circuit may be configured to generate third time-series data of the battery current repeatedly detected during the charging procedure. The control circuit may be configured to generate fourth time-series data of the battery current repeatedly detected during the discharging procedure. The control circuit may be configured to determine a first accumulated quantity of the battery current in the charging procedure from the third time-series data and a second accumulated quantity of the battery current in the discharging procedure from the fourth time-series data. The control circuit may be configured to determine that the battery cell is shorted internally when (i) the first change amount is equal to or larger than a first threshold change amount, (ii) the second change amount is equal to or larger than a second threshold change amount, and (iii) a ratio of the second accumulated quantity to the first accumulated quantity is less than a threshold ratio.

The control circuit may be configured to determine a first average change rate of the swelling status in an early stage of the charging procedure and a second average change rate of the swelling status in a late stage of the charging procedure from the first time-series data. The control circuit may be configured to determine that the battery cell is shorted internally when (i) the first change amount is equal to or larger than a first threshold change amount, and (ii) a ratio of the second average change rate to the first average change rate is equal to or larger than a threshold ratio.

A battery pack according to another aspect of the present disclosure includes the battery management system.

An electric vehicle according to still another aspect of the present disclosure includes the battery pack.

A battery management method according to yet another aspect of the present disclosure includes generating first time-series data of a swelling status of a battery cell repeatedly detected during a charging procedure included in a charge/discharge cycle of the battery cell; determining a first change amount of the swelling status from the first time-series data; and determining whether the battery cell is shorted internally based on the first change amount.

The step of determining the first change amount of the swelling status may include determining, as the first change amount, a difference between a minimum swelling status and a maximum swelling status of the first time-series data or a difference between the swelling status detected at a point in time when a predetermined time passed from a start time of the charging procedure and the maximum swelling status of the first time-series data.

The step of determining whether the battery cell is shorted internally may include determining that the battery cell is shorted internally when the first change amount is equal to or larger than a first threshold change amount.

The battery management method may further include generating second time-series data of the swelling status repeatedly detected during a discharging procedure included in the charge/discharge cycle, the discharging procedure being performed after the charging procedure; and determining a second change amount of the swelling status from the first time-series data and the second time-series data, wherein the second change amount is a difference between a minimum swelling status of the first time-series data and a minimum swelling status of the second time-series data. The step of determining whether the battery cell is shorted internally may include determining whether the battery cell is shorted internally based on the first change amount and the second change amount.

The battery management method may further include generating third time-series data of a battery current flowing through the battery cell repeatedly detected during the charging procedure; generating fourth time-series data of the battery current repeatedly detected during the discharging procedure; and determining a first accumulated quantity of the battery current in the charging procedure and a second accumulated quantity of the battery current in the discharging procedure from the third time-series data and the fourth time-series data.

The step of determining whether the battery cell is shorted internally may include determining that the battery cell is shorted internally when (i) the first change amount is equal to or larger than a first threshold change amount, (ii) the second change amount is equal to or larger than a second threshold change amount, and (iii) a ratio of the second accumulated quantity to the first accumulated quantity is less than a threshold ratio.

Advantageous Effects

According to at least one of the embodiments of the present disclosure, it is possible to detect the internal short circuit fault in the battery cell by analyzing the time-series data of the swelling status of the battery cell detected during the charge/discharge cycle based on the correlation between the swelling status of the battery cell and the internal short circuit fault.

Additionally, according to at least one of the embodiments of the present disclosure, it is possible to detect the internal short circuit fault in the battery cell more precisely by additionally using the time-series data of the battery current detected in synchronization with the swelling status of the battery cell.

The effects of the present disclosure are not limited to the above-mentioned effects, and these and other effects will be clearly understood by those skilled in the art from the appended claims.

BRIEF DESCRIPTION OF DRAWINGS

The accompanying drawings illustrate an exemplary embodiment of the present disclosure, and together with the following detailed description of the present disclosure, serve to provide a further understanding of the technical aspects of the present disclosure, and thus the present disclosure should not be construed as being limited to the drawings.

EMBODIMENTS OF THE PRESENT DISCLOSURE

Figure 1:
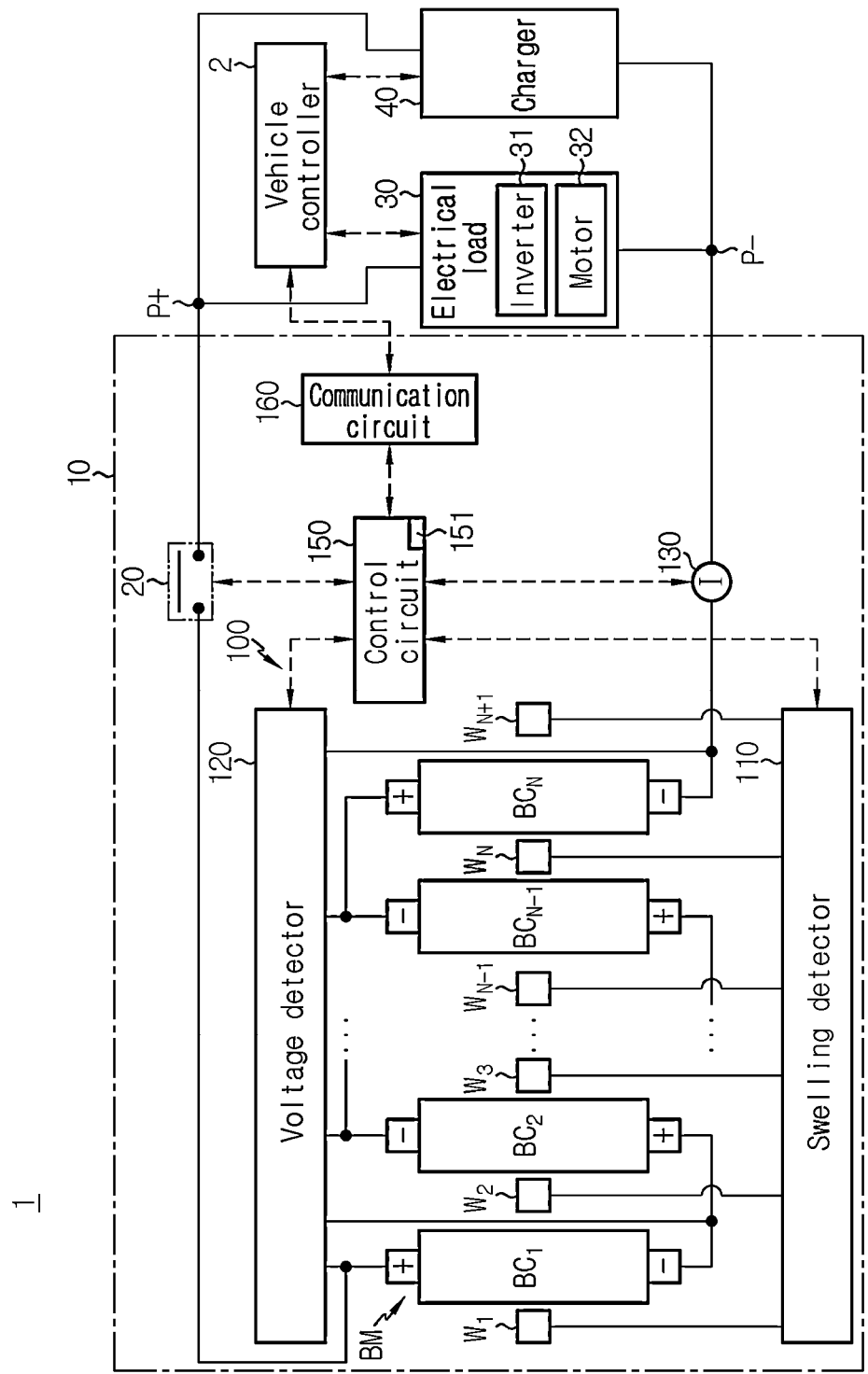
FIG. 1 is a diagram exemplarily showing the components of an electric vehicle according to the present disclosure.

Hereinafter, exemplary embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are exemplary embodiments of the present disclosure, but not intended to fully describe the technical aspects of the present disclosure, so it should be understood that a variety of other equivalents and modifications could have been made thereto at the time that the application was filed.

The terms including the ordinal number such as "first," "second," and the like, are used to distinguish one element from another among various elements, but not intended to limit the elements.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented in hardware and software either alone or in combination.

In addition, throughout the specification, it will be further understood that when an element is referred to as being "connected to" another element, it can be directly connected to the other element or intervening elements may be present.

FIG. 1 is a diagram exemplarily showing the components of an electric vehicle according to the present disclosure.

Referring to FIG. 1, the electric vehicle 1 includes a vehicle controller 2, a battery pack 10 and an electrical load 30. Charge/discharge terminals P+, P− of the battery pack 10 may be electrically coupled to the electrical load 30 and a charger 40. The charger 40 may be included in the electric vehicle 1 or may be disposed in a charging station.

The vehicle controller 2 (for example, an Electronic Control Unit (ECU)) is configured to transmit a key-on signal to a battery management system 100 in response to an ignition button (not shown) of the electric vehicle 1 being changed to ON-position by a user. The vehicle controller 2 is configured to transmit a key-off signal to the battery management system 100 in response to the ignition button being changed to OFF-position by the user. The charger 40 may supply a charge power of constant current or constant voltage through the charge/discharge terminals P+, P− of the battery pack 10 by the communication with the vehicle controller 2.

The battery pack 10 includes a battery module BM, a relay 20 and the battery management system 100. Although FIG. 1 shows the battery pack 10 including a single battery module BM, the battery pack 10 may include two or more battery modules BM connected either in series or in parallel or both.

The battery module BM includes a plurality of battery cells $BC_1$~$BC_N$ (N is a natural number of 2 or greater). The plurality of battery cells $BC_1$~$BC_N$ is connected in series. The plurality of battery cells $BC_1$~$BC_N$ may be manufactured with the same electrical and chemical specification. FIG. 1 shows the plurality of battery cells $BC_1$~$BC_N$ arranged in an order from $BC_1$ to $BC_N$. The battery cell (for example, $BC_1$) may be spaced a predetermined distance apart from its adjacent other battery cell (for example, $BC_2$) by a spacer (not shown) of the battery module BM. Accordingly, it is possible to remove the influence of swelling of the battery cell (for example, $BC_1$) on swelling of another battery cell (for example, $BC_2$).

Hereinafter, in the common description to the plurality of battery cells $BC_1$~$BC_N$, the reference character 'BC' is given to the battery cell. The battery cell BC is not limited to a particular type and may include any type of battery cell that can be recharged repeatedly, for example, a lithium ion cell.

The relay 20 is electrically connected in series to the battery module BM through a power path connecting the battery module BM to an inverter 31. FIG. 1 shows the relay 20 connected between a positive terminal of the battery module BM and the charge/discharge terminal P+. The relay 20 is controlled into on/off in response to a switching signal from the battery management system 100. The relay 20 may be a mechanical contactor that is turned on and off by the electromagnetic force of the coil or a semiconductor switch such as a Metal Oxide Semiconductor Field Effect transistor (MOSFET).

The electrical load 30 includes the inverter 31 and an electric motor 32. The inverter 31 is provided to convert the direct current from the battery module BM included in the battery pack 10 to an alternating current in response to a command from the battery management system 100 or the vehicle controller 2. The electric motor 32 operates using the alternating current power from the inverter 31. The electric motor 32 may include, for example, a 3-phase alternating current motor.

The battery management system 100 includes a swelling detector 110 and a control circuit 150. The battery management system 100 may further include at least one of a voltage detector 120, a current detector 130 or a communication circuit 160.

The swelling detector 110 is configured to detect a swelling status of each of the plurality of battery cells $BC_1$~$BC_N$ and to generate a swelling signal indicating the detected swelling status.

The swelling detector 110 may include a plurality of swelling sensors $W_1$~$W_N$ or $W_1$~$W_{N+1}$. Hereinafter, in the common description to the plurality of swelling sensors $W_1$~$W_N$, the reference character 'W' is given to the swelling sensor. The swelling status may be a thickness of the battery cell BC or a load acting on the battery cell BC, detected by the swelling sensor W in contact or noncontact with the battery cell BC. The swelling status may be referred to as a swelling quantity or a swelling value. The swelling sensor W may include, for example, at least one of known swelling detection devices, such as an infrared sensor, a strain gauge, a piezoelectric sensor, and an image sensor.

Assume that i is a natural number of N or smaller. FIG. 1 shows two swelling sensors $W_i$, $W_{i+1}$ on the two sides of the battery cell $BC_i$ on the basis of the arrangement direction of the plurality of battery cells $BC_1$~$BC_N$.

In an example, the swelling status of the battery cell $BC_i$ may be detected by the swelling sensor $W_i$ or the swelling sensor $W_{i+1}$. In another example, the swelling status of the battery cell $BC_i$ may be detected by the two swelling sensors $W_i$, $W_{i+1}$ on the two sides of the battery cell $BC_i$.

The voltage detector 120 is connected to positive and negative terminals of each of the plurality of battery cells $BC_1$~$BC_N$ and is configured to detect a voltage across the battery cell BC and generate a voltage signal indicating the detected cell voltage.

The current detector 130 is connected in series to the battery module BM through the current path between the battery module BM and the inverter 31. The current detector 130 is configured to detect a battery current flowing through the battery module BM and to generate a current signal indicating the detected battery current. Since the plurality of battery cells $BC_1$~$BC_N$ is connected in series, the common battery current flows through the plurality of battery cells $BC_1 \sim BC_N$. The current detector 130 may include at least one of known current detection devices such as a shunt resistor and a hall effect device.

The communication circuit 160 is configured to support wired or wireless communication between the control circuit 150 and the vehicle controller 2. The wired communication may be, for example, controller area network (CAN) communication, and the wireless communication may be, for example, Zigbee or Bluetooth communication. The communication protocol is not limited to a particular type and may include any type of communication protocol that supports wired/wireless communication between the control circuit 150 and the vehicle controller 2. The communication circuit 160 may include an output device (for example, a display, a speaker) to provide information received from the control circuit 150 and/or the vehicle controller 2 in a recognizable format for the user (a driver).

The control circuit 150 may be also referred to as a "battery controller" and may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

The control circuit 150 is operably coupled to the relay 20, the detectors 110, 120, 130 and/or the communication circuit 160. Operably coupled refers to connected directly/indirectly to transmit and receive a signal in one or two directions.

The control circuit 150 may collect the voltage signal from the voltage detector 120 and/or the current signal from the current detector 130 at a predetermined time interval during the charging, discharging and/or rest of the battery module BM. That is, the control circuit 150 may acquire a detected swelling value, a detected voltage value and/or a detected current value from the analog signals collected from the detectors 110, 120, 130 using an Analog to Digital Converter (ADC) within the control circuit 150 and record them in memory 151. Accordingly, a time-series data of each of the swelling status, the voltage and/or the battery current of the battery cell BC is generated. For reference, the time-series data is a collection (sequence) of values acquired in a time series over an arbitrary period of time.

The memory 151 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM), or programmable read-only memory (PROM). The memory 151 may store data and programs required for the computation by the control circuit 150. The memory 151 may store data indicating the computation results by the control circuit 150. The memory 151 may store a plurality of algorithms applied to detect an internal short circuit fault in the battery cell BC. The memory 151 may be integrated into the control circuit 150.

When the relay 20 is turned on during the operation of the electrical load 30 and/or the charger 40, the battery module BM goes into a charge mode or a discharge mode. When the relay 20 is turned off while the battery module BM is in the charge mode or the discharge mode, the battery module BM is switched to a rest mode.

The control circuit 150 may turn on the relay 20 in response to the key-on signal. The control circuit 150 may turn off the relay 20 in response to the key-off signal. The key-on signal is a signal requesting the switch from rest to charge or discharge. The key-off signal is a signal requesting the switch from charge or discharge to rest. Alternatively, instead of the control circuit 150, the vehicle controller 2 may take responsibility for the ON/OFF control of the relay 20.

During the charging of the battery pack 10, the control circuit 150 may monitor the voltage of each of the plurality of battery cells $BC_1 \sim BC_N$ and identify a maximum voltage of the plurality of battery cells $BC_1 \sim BC_N$. The maximum voltage is the maximum one of the voltages of the plurality of battery cells $BC_1 \sim BC_N$.

The control circuit 150 may perform a charge/discharge cycle by controlling the electrical load 30 and the charger 40 to detect the internal short circuit fault in the battery cell BC. The charge/discharge cycle is (i) a cycle of a charging procedure and a discharging procedure or (iii) a cycle of a charging procedure, a resting procedure and a discharging procedure. The charging procedure may start on the condition that the OCV of the battery cell BC is equal to or lower than a predetermined voltage level (for example, 3.1V). The charging procedure may be performed according to the known constant current (CC)-constant voltage (CV) profile. The CC current rate and the CV charge voltage may be preset according to the electrical and chemical specification of the battery cell BC. The charging procedure may end on the condition that the CV battery current reaches a predetermined cutoff current (for example, 0.05 A). The resting procedure starts when the charging procedure ends. The resting procedure is to stabilize the electrical and chemical instability of the battery cell BC caused by the charging procedure. The discharging procedure starts when the resting procedure ends. Each of the current level (for example, 0.65 A) of the CC charge, the voltage level (for example, 4.25V) of the CV charge and the duration of the resting procedure (for example, 30 min) is appropriately preset taking into account the specification and characteristics of the battery cell BC. The current level (for example, −1.0 A) of the discharging procedure is appropriately preset taking into account the specification and characteristics of the battery cell BC.

The charge/discharge cycle is not limited to the foregoing description, and any modification may be made to observe the swelling status reflecting an apparent correlation between the swelling status and the internal short circuit fault.

Figure 2:
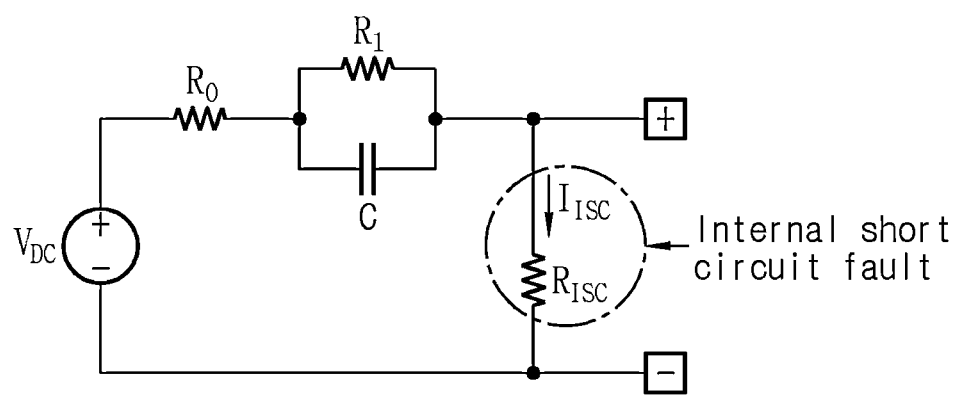
FIG. 2 is a diagram for reference in describing an exemplary equivalent circuit of a battery cell.
Figure 3:
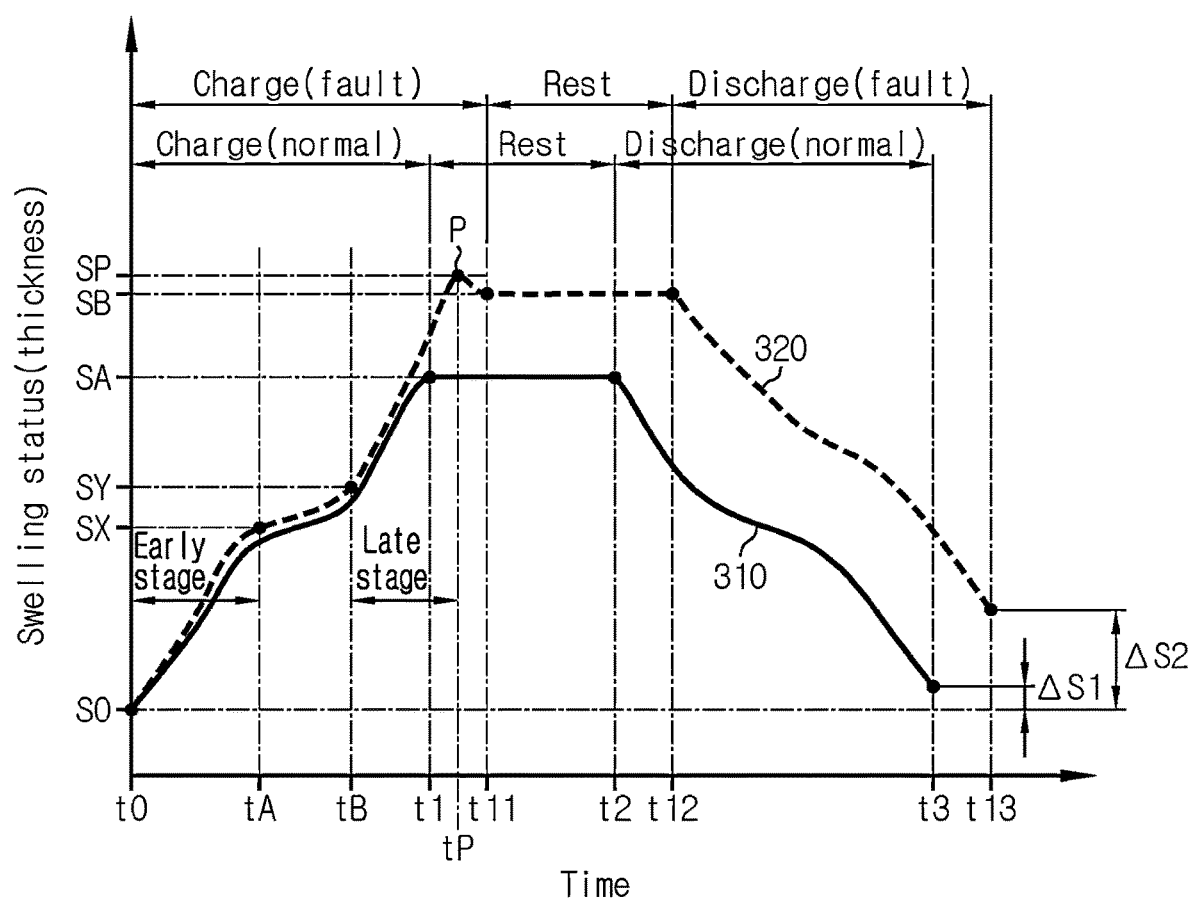
FIG. 3 is a graph exemplarily showing a time-dependent change in a swelling status of a battery cell during a charge/discharge cycle.

FIG. 2 is a diagram for reference in describing an exemplary equivalent circuit of the battery cell, and FIG. 3 is a graph exemplarily showing a time-dependent change in the swelling status of the battery cell during the charge/discharge cycle. In the specification, a faulty battery cell refers to a battery cell with an internal short circuit fault as opposed to a normal battery cell.

Referring to FIG. 2, the normal battery cell may be equalized to a series circuit of a series voltage source $V_{DC}$, an internal resistance component $R_0$ and a RC pair $R_1$, C. In contrast, the faulty battery cell may be equalized to a series circuit with an additional resistance component $R_{ISC}$ connected between the two terminals of the series circuit corresponding to the normal battery cell. The additional resistance component $R_{ISC}$ is an internal short circuit that acts as a path of a leakage current $I_{ISC}$. A reduction in resistance value of the internal short circuit $R_{ISC}$ signifies a more severe internal short circuit fault, and as the internal short circuit fault gets worse, the power consumption by the leakage current $I_{ISC}$ may increase.

FIG. 3 shows a time-dependent change in swelling status by the charge/discharge cycle including the charging procedure, the resting procedure and constant current the discharging procedure according to the predetermined CC-CV profile. In FIG. 3, a curve 310 shows the swelling status of the normal battery cell, and a curve 320 shows the swelling status of the faulty battery cell. To help understanding, the start time of the charging procedure associated with the two curves 410, 420 is equally matched to time t0, and assume that the swelling status of the normal battery cell and the faulty battery cell at time t0 is equally S0.

In the curve 310, t1, t2 and t3 are, respectively, the end time of the charging procedure (=the start time of the resting procedure), the end time of the resting procedure (=the start time of the discharging procedure) and the end time of the discharging procedure (=the completion time of the charge/discharge cycle) for the normal battery cell. In the curve 310, the swelling status keeps increasing from the time t0 to the time t1. That is, in the curve 310, the swelling status of the charging procedure is at the maximum at the time t1.

In the curve 320, t11, t12 and t13 are, respectively, the end time of the charging procedure, the end time of the resting procedure and the end time of the discharging procedure for the faulty battery cell. In the curve 320, there is a peak P corresponding to the maximum swelling status SP at time tP that is earlier than the time t11, and the maximum swelling status SP is larger than the swelling status SB at the end of the charging procedure. That is, in the curve 320, the swelling status keeps increasing from the time t0 and is at the maximum SP at the time tP, and then keeps decreasing from the time tP to time t11. Presumably, the peak P appearing before the end of the charging procedure is because the constant current charge is switched to the constant voltage charge near the time tP, so the charge current keeps decreasing during the constant voltage charge, and this change in charge current affects the swelling status of the faulty battery cell more greatly than the normal battery cell.

In the charging procedure, compared to the normal battery cell, some of the charge power is not stored in the faulty battery cell and is consumed as the leakage current $I_{ISC}$. Accordingly, in the faulty battery cell, the temperature rise, the gas generation, the expansion of the electrode material and the growth of deposition (for example, lithium metal occurs faster, and as a consequence, swelling gets worse. Additionally, the time t11–t0 required to perform the charging procedure for the faulty battery cell is longer than the time t1–t0 required to perform the charging procedure for the normal battery cell.

The inventor found that the swelling status of the faulty battery cell increases in the late stage tB~t1 of the charging procedure faster than the early stage t0~tA. The corresponding phenomenon may occur, largely, due to two causes: (i) accumulation of leakage current $I_{ISC}$ induced instability in the faulty battery cell over the charging procedure starting from the time t0, and (ii) the gradual increase in voltage of the faulty battery cell during the charging procedure. The cause (ii) is based on the Ohm's Law that the leakage current $I_{ISC}$ increases from the increase in voltage of the faulty battery cell.

Subsequently, the duration t2–t1 of the resting procedure for the normal battery cell and the duration t12–t11 of the resting procedure for the faulty battery cell may be equal.

Subsequently, in the discharging procedure, compared to the normal battery cell, some of the discharge power of the faulty battery cell is not supplied to the electrical load and is consumed as the leakage current $I_{ISC}$. Accordingly, in the discharging procedure, due to the consumption of additional discharge power of the leakage current $I_{ISC}$ from the faulty battery cell, the time t13–t12 required to perform the discharging procedure for the faulty battery cell is shorter than the time t3–t2 required to perform the discharging procedure for the normal battery cell. Additionally, a difference ΔS2 between a minimum swelling status of the charging procedure and a minimum swelling status of the discharging procedure for the faulty battery cell BC is larger a few times to a few tens of times than a difference ΔS1 between a minimum swelling status of the charging procedure and a minimum swelling status of the discharging procedure for the normal battery cell. Presumably, it is caused by the gas and deposition in the faulty battery cell still remaining after the discharging procedure and the expansion of the packaging of the faulty battery cell due to the temperature rise to the greater extent than the normal battery cell.

Figure 4:
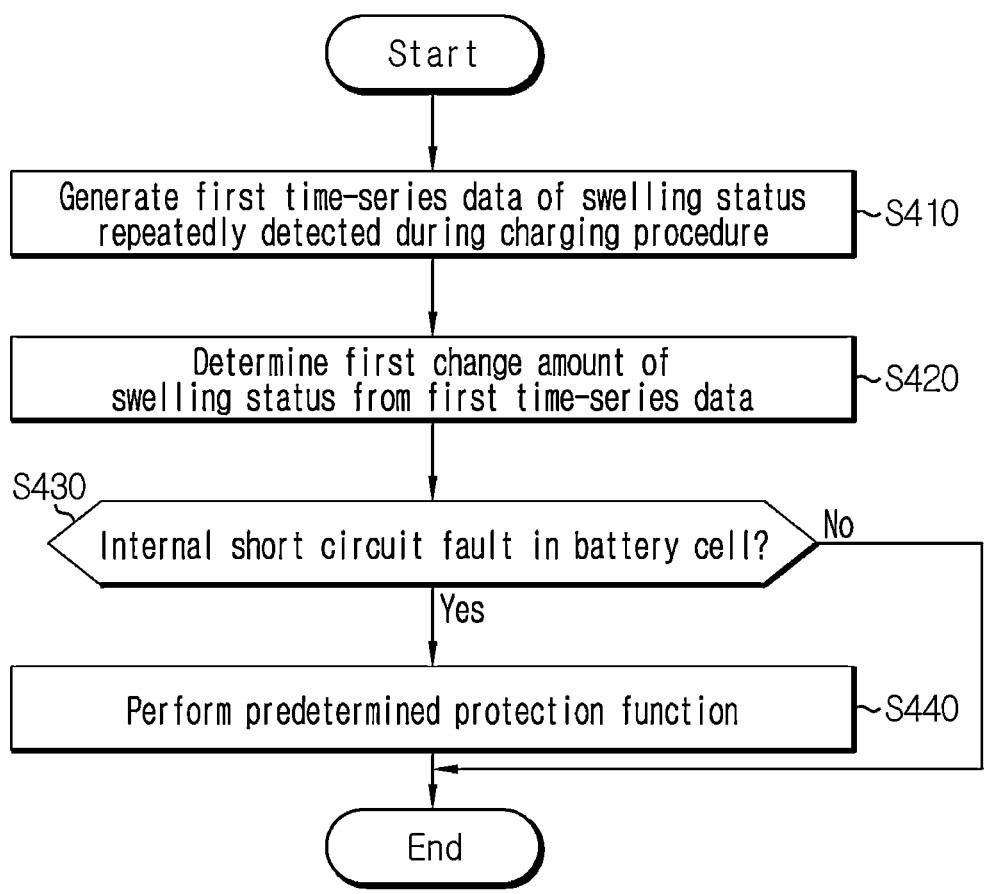
FIG. 4 is a flowchart exemplarily showing a battery management method according to a first embodiment of the present disclosure.

FIG. 4 is a flowchart exemplarily showing a battery management method according to a first embodiment of the present disclosure.

Referring to FIGS. 1 to 4, in step S410, the control circuit 150 generates first time-series data of the swelling status of the battery cell BC repeatedly detected during the charging procedure included in the charge/discharge cycle. In the curve 310, the range of the period of time t0~t1 corresponds to the first time-series data generated when the battery cell BC is normal. In the curve 320, the range of the period of time t0~t11 corresponds to the first time-series data generated when the battery cell BC is shorted internally.

In step S420, the control circuit 150 determines a first change amount of the swelling status in the charging procedure from the first time-series data. The first change amount may be a difference between the minimum swelling status and the maximum swelling status of the first time-series data. Alternatively, the first change amount may be a difference between the swelling status detected after a predetermined time passes from the start time of the charging procedure and the maximum swelling status of the first time-series data. Hereinafter, assume that the first change amount is a difference between the minimum swelling status and the maximum swelling status of the first time-series data.

Referring to the curve 310 of FIG. 3, when the battery cell BC is normal, the swelling status at the start time t0 of the charging procedure is at the minimum and the swelling status at the end time t1 is at the maximum, and thus the first change amount is SA–S0. In contrast, referring to the curve 320, when the battery cell BC is faulty, the swelling status at the start time t0 of the charging procedure is at the minimum and the swelling status at time tP that is earlier than the end time t11 is at the maximum, and thus the first change amount is SP–S0.

In step S430, the control circuit 150 determines whether the battery cell BC is shorted internally based on the first change amount. In an example, when the first change amount is equal to or larger than a first threshold change amount, it is determined that the battery cell BC is shorted internally. When a value of the step S430 is "Yes," step S440 may be performed.

In the step S440, the control circuit 150 performs a predetermined protection function. In an example, the control circuit 150 may output a notification message indicating that the battery cell BC is shorted internally to the vehicle controller 2 and/or a user (for example, a driver) through the communication circuit 160. In another example, the control circuit 150 may limit the allowable value of charge voltage, discharge voltage, charge current and/or discharge current by a predetermined value.

The battery management methods according to the second to fourth embodiments as described below are a variation of the battery management method according to the first embodiment. Accordingly, in describing the embodiments, the repeated common description may be omitted.

Figure 5:
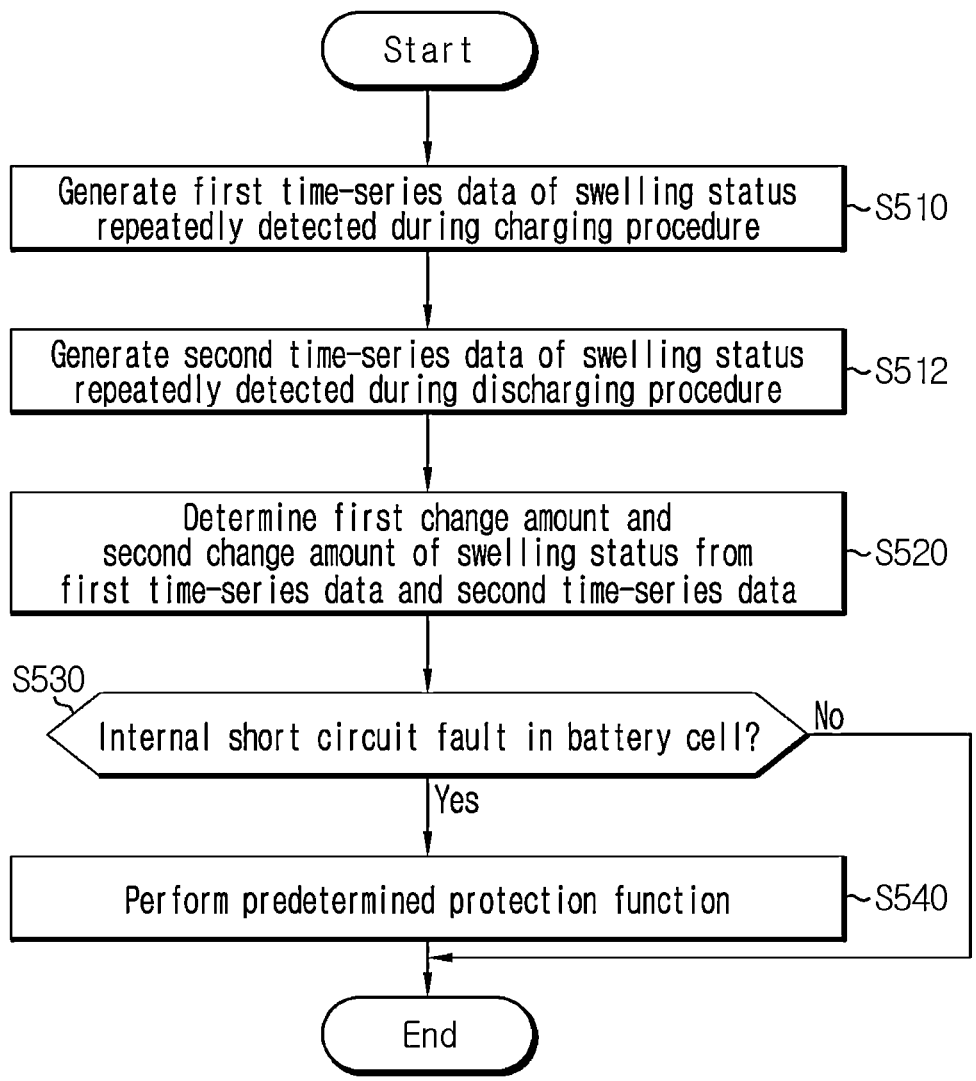
FIG. 5 is a flowchart exemplarily showing a battery management method according to a second embodiment of the present disclosure.

FIG. 5 is a flowchart exemplarily showing a battery management method according to a second embodiment of the present disclosure.

Referring to FIGS. 1 to 3 and 5, in step S510, the control circuit 150 generates first time-series data of the swelling status of the battery cell BC repeatedly detected during the charging procedure included in the charge/discharge cycle.

In step S512, the control circuit 150 generates second time-series data of the swelling status of the battery cell BC repeatedly detected during the discharging procedure included in the charge/discharge cycle. In the curve 310, the range of the period of time t2~t3 corresponds to the second time-series data generated when the battery cell BC is normal. In the curve 320, the range of the period of time t12~t13 corresponds to the first time-series data generated when the battery cell BC is shorted internally.

In step S520, the control circuit 150 determines a first change amount of the swelling status in the charging procedure and a second change amount of the swelling status in the discharging procedure from the first time-series data and the second time-series data. The second change amount is a difference between the minimum swelling status of the discharging procedure and the minimum swelling status of the charging procedure. In FIG. 3, when the battery cell BC is normal, the second change amount is $\Delta S1$. In contrast, when the battery cell BC is faulty, the second change amount is $\Delta S2$.

In step S530, the control circuit 150 determines whether the battery cell BC is shorted internally based on the first change amount and the second change amount.

In an example, when the first change amount is equal to or larger than a first threshold change amount and the second change amount is equal to or larger than a second threshold change amount, it is determined that the battery cell BC is shorted internally. In another example, when a sum of the first change amount and the second change amount is equal to or larger than a third threshold change amount, it is determined that the battery cell BC is shorted internally. In still another example, when a weighted sum (or a weighted average) of the first change amount and the second change amount is equal to or larger than a fourth threshold change amount, it is determined that the battery cell BC is shorted internally. When a value of the step S530 is "Yes", step S540 may be performed.

In the step S540, the control circuit 150 performs a predetermined protection function.

Figure 6:
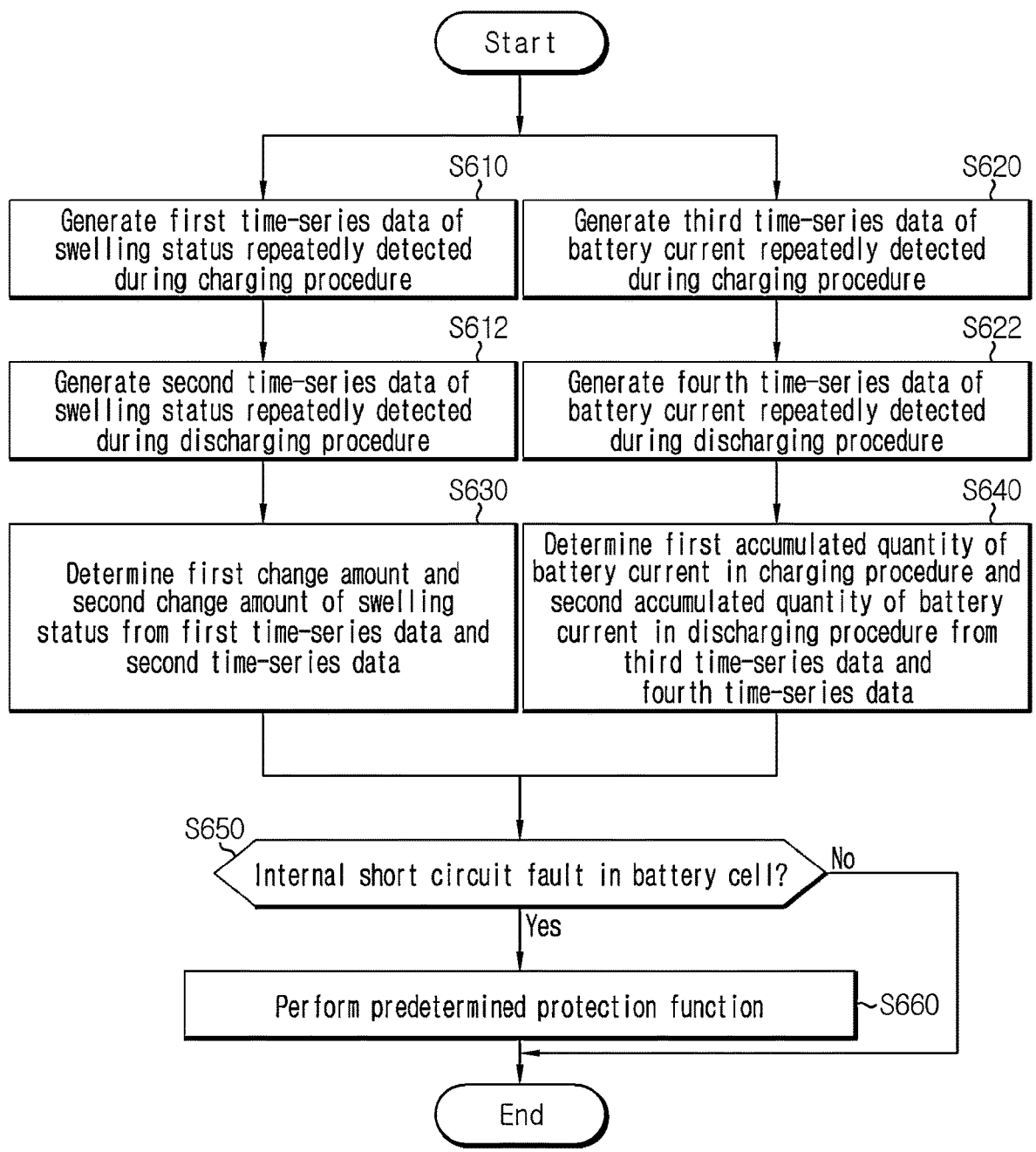
FIG. 6 is a flowchart exemplarily showing a battery management method according to a third embodiment of the present disclosure.

FIG. 6 is a flowchart exemplarily showing a battery management method according to a third embodiment of the present disclosure.

Referring to FIGS. 1 to 3 and 6, in step S610, the control circuit 150 generates first time-series data of the swelling status of the battery cell BC repeatedly detected during the charging procedure included in the charge/discharge cycle.

In step S612, the control circuit 150 generates second time-series data of the swelling status of the battery cell BC repeatedly detected during the discharging procedure included in the charge/discharge cycle.

In step S620, the control circuit 150 generates third time-series data of the battery current of the battery cell BC repeatedly detected during the charging procedure.

In step S622, the control circuit 150 generates fourth time-series data of the battery current of the battery cell BC repeatedly detected during the discharging procedure.

In step S630, the control circuit 150 determines a first change amount of the swelling status by the charging procedure and a second change amount of the swelling status by the discharging procedure from the first time-series data and the second time-series data.

In step S640, the control circuit 150 determines a first accumulated quantity of the battery current in the charging procedure and a second accumulated quantity of the battery current in the discharging procedure from the third time-series data and the fourth time-series data. The first accumulated quantity indicates an accumulated value of the charge current flowing through the battery cell BC from the start time of the charging procedure to the end time. The second accumulated quantity indicates an accumulated value of the discharge current flowing through the battery cell BC from the start time of the discharging procedure to the end time. A ratio of the second accumulated quantity to the first accumulated quantity, (the second accumulated quantity)/(first calculated quantity), indicates a Coulomb efficiency of the battery cell BC.

In step S650, the control circuit 150 determines whether the battery cell BC is shorted internally based on the first change amount, the second change amount, the first accumulated quantity and the second accumulated quantity.

In an example, when the first change amount is equal to or larger than a first threshold change amount, the second change amount is equal to or larger than a second threshold change amount, and the ratio of the second accumulated quantity to the first accumulated quantity is less than a threshold ratio, it is determined that the battery cell BC is shorted internally.

In another example, when a sum of the first change amount and the second change amount is equal to or larger than a third threshold change amount and the ratio of the second accumulated quantity to the first accumulated quantity is less than the threshold ratio, it is determined that the battery cell BC is shorted internally.

In still another example, when a weighted sum (or a weighted average) of the first change amount and the second change amount is equal to or larger than a fourth threshold change amount and the ratio of the second accumulated quantity to the first accumulated quantity is less than the threshold ratio, it is determined that the battery cell BC is shorted internally. When a value of the step S650 is "Yes," step S660 may be performed.

In the step S660, the control circuit 150 performs a predetermined protection function.

Figure 7:
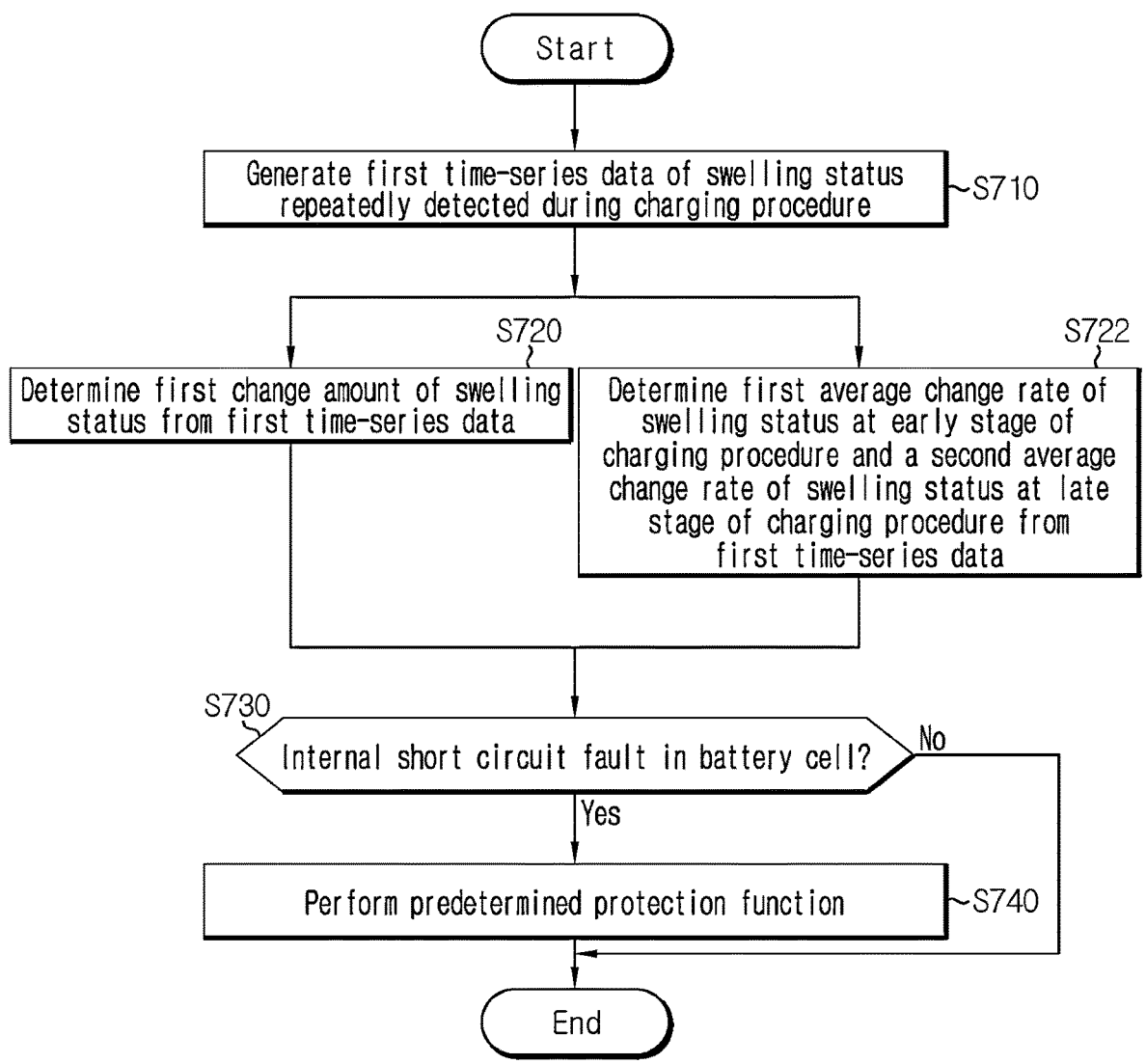
FIG. 7 is a flowchart exemplarily showing a battery management method according to a fourth embodiment of the present disclosure.

FIG. 7 is a flowchart exemplarily showing a battery management method according to a fourth embodiment of the present disclosure.

Referring to FIGS. 1 to 3 and 7, in step S710, the control circuit 150 generates first time-series data of the swelling status of the battery cell BC repeatedly detected during the charging procedure included in the charge/discharge cycle.

In step S720, the control circuit 150 determines a first change amount of the swelling status by the charging procedure from the first time-series data.

In step S722, the control circuit 150 determines a first average change rate of the swelling status at the early stage of the charging procedure and a second average change rate of the swelling status at the late stage of the charging procedure from the first time-series data.

The early stage of the charging procedure is a period of time from the start time t0 of the charging procedure to a point in time after a first time passed from the start time t0 of the charging procedure. In the curve 320 of FIG. 3, the early stage of the charging procedure is a period of time from the start time t0 of the charging procedure to time tA. The first time may be equal to the multiplication of a reference time of the charging procedure by a first coefficient (a positive number of less than 1). The reference time is a time interval between a point in time when the minimum swelling status is detected and a point in time when the maximum swelling status is detected. In an example, where the reference time tP−t0=150 min and the first coefficient=0.2, the first time=30 min. Alternatively, the first time may be preset. The first average change rate is the product of dividing the change amount SX−S0 of the swelling status at the early stage by the first time.

The late stage of the charging procedure is a period of time from a point in time when the maximum swelling status of the charging procedure is detected until a second time. In the curve 320 of FIG. 3, the late stage of the charging procedure is a period of time from time tB of the charging procedure to time tP. The second time may be equal to the multiplication of the reference time by a second coefficient (a positive number of less than 1). In an example, where the reference time tP−t0=150 min and the second coefficient=0.1, the second time=15 min. Alternatively, the second time may be preset. The second average change rate is the product of dividing the change amount SP−SY of the swelling status at the late stage by the second time.

In step S730, the control circuit 150 determines whether the battery cell BC is shorted internally based on the first change amount, the first average change rate and the second average change rate.

In an example, when the first change amount is equal to or larger than a first threshold change amount and a ratio of the second average change rate to the first average change rate is less than a threshold ratio, it is determined that the battery cell BC is shorted internally.

In another example, when the first change amount is equal to or larger than the first threshold change amount and a difference between the first average change rate and the second average change rate is equal to or larger than a threshold change rate, it is determined that the battery cell BC is shorted internally. When a value of the step S730 is "Yes," step S740 may be performed.

In the step S740, the control circuit 150 performs a predetermined protection function.

The embodiments of the present disclosure described hereinabove are not implemented only through the apparatus and method, and may be implemented through programs that perform the functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto, and it is obvious to those skilled in the art that various modifications and changes may be made thereto within the technical aspects of the present disclosure and the scope of the appended claims and their equivalents.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and all or some of the embodiments may be selectively combined to allow various modifications.

(Description of Reference Numerals)

| | |
|---|---|
| 1: Electric vehicle | 10: Battery pack |
| BM: Battery module | BC: Battery cell |
| 100: Battery management system | |
| 110: Swelling detector | |
| 150: Control circuit | |

What is claimed is:

1. A battery management system, comprising:
a swelling detector including at least one sensor configured to detect a swelling status of a battery cell; and
a control circuit configured to generate first time-series data of the swelling status repeatedly detected during a charging procedure included in a charge/discharge cycle of the battery cell and second time-series data of the swelling status repeatedly detected during a discharging procedure included in the charge/discharge cycle, the discharging procedure being performed after the charging procedure,
wherein the control circuit is further configured to:
determine a first change amount of the swelling status by the charging procedure from the first time-series data, wherein the first change amount is a difference between a minimum swelling status and a maximum swelling status of the first time-series data or a difference between the swelling status detected at a predetermined time after a start time of the charging procedure and the maximum swelling status of the first time-series data,
determine a second change amount of the swelling status from the first time-series data and the second time-series data, wherein the second change amount is a difference between a minimum swelling status of the first time-series data and a minimum swelling status of the second time-series data, and
determine whether the battery cell is shorted internally based on the first change amount and the second change amount.

2. The battery management system according to claim 1, wherein the swelling status is a thickness of the battery cell or a load acting on the battery cell.

3. The battery management system according to claim 1, wherein the control circuit is configured to determine that the battery cell is shorted internally when the first change amount is equal to or larger than a pre-stored or predetermined first threshold change amount and the second change amount is equal to or larger than a pre-stored or predetermined second threshold change amount.

4. The battery management system according to claim 1, further comprising:
a current detector configured to detect a battery current flowing through the battery cell,
wherein the control circuit is further configured to:
generate third time-series data of the battery current repeatedly detected during the charging procedure, generate fourth time-series data of the battery current repeatedly detected during the discharging procedure, determine a first accumulated quantity of the battery current in the charging procedure from the third time-series data and a second accumulated quantity of the battery current in the discharging procedure from the fourth time-series data, and determine that the battery cell is shorted internally if the first change amount is equal to or larger than a pre-stored or predetermined first threshold change amount, the second change amount is equal to or larger than a pre-stored or predetermined second threshold change amount, and a ratio of the second accumulated quantity to the first accumulated quantity is less than a pre-stored or predetermined threshold ratio.

5. A battery pack comprising the battery management system according to claim 1.

6. An electric vehicle comprising the battery pack according to claim 5.

7. The battery management system of claim 1, wherein the control circuit is further configured to limit an allowable amount of a charge voltage, a discharge voltage, a charge current, or a discharge voltage if the battery cell is determined to be shorted internally.

8. A battery management method, comprising:
   detecting a swelling status of a battery cell;
   generating first time-series data of the swelling status of the battery cell repeatedly detected during a charging procedure included in a charge/discharge cycle of the battery cell;
   generating second time-series data of the swelling status repeatedly detected during a discharging procedure included in the charge/discharge cycle, the discharging procedure being performed after the charging procedure;
   determining a first change amount of the swelling status from the first time-series data, wherein the first change amount is a difference between a minimum swelling status and a maximum swelling status of the first time-series data or a difference between the swelling status detected at a predetermined time after a start time of the charging procedure and the maximum swelling status of the first time-series data;
   determining a second change amount of the swelling status from the first time-series data and the second time-series data, wherein the second change amount is a difference between a minimum swelling status of the first time-series data and a minimum swelling status of the second time-series data; and
   determining whether the battery cell is shorted internally based on the first change amount and the second change amount.

9. The battery management method according to claim 8, wherein the step of determining whether the battery cell is shorted internally comprises determining that the battery cell is shorted internally when the first change amount is equal to or larger than a pre-stored or predetermined first threshold change amount.

10. The battery management method according to claim 8, further comprising:
    generating third time-series data of a battery current flowing through the battery cell repeatedly detected during the charging procedure;
    generating fourth time-series data of the battery current repeatedly detected during the discharging procedure; and
    determining a first accumulated quantity of the battery current in the charging procedure and a second accumulated quantity of the battery current in the discharging procedure from the third time-series data and the fourth time-series data,
    wherein the determining of whether the battery cell is shorted internally comprises determining that the battery cell is shorted internally if the first change amount is equal to or larger than a pre-stored or predetermined first threshold change amount, the second change amount is equal to or larger than a pre-stored or predetermined second threshold change amount, and a ratio of the second accumulated quantity to the first accumulated quantity is less than a pre-stored or predetermined threshold ratio.

11. The battery management method of claim 8, wherein the swelling status is a thickness of the battery cell or a load acting on the battery cell.

12. The battery management method of claim 8, further comprising:
    limiting an allowable amount of a charge voltage, a discharge voltage, a charge current, or a discharge voltage if the battery cell is determined to be shorted internally.

13. A battery management system, comprising:
    a swelling detector including at least one sensor configured to detect a swelling status of a battery cell; and
    a control circuit configured to generate first time-series data of the swelling status repeatedly detected during a charging procedure included in a charge/discharge cycle of the battery cell,
    wherein the control circuit is further configured to:
        determine a first change amount of the swelling status by the charging procedure from the first time-series data, wherein the first change amount is a difference between a minimum swelling status and a maximum swelling status of the first time-series data or a difference between the swelling status detected at a predetermined time after a start time of the charging procedure and the maximum swelling status of the first time-series data,
        determine a first average change rate of the swelling status in an early stage of the charging procedure and a second average change rate of the swelling status in a late stage of the charging procedure after the early stage from the first time-series data, and
        determine that the battery cell is shorted internally based on the first change amount and a ratio of the second average change rate to the first average change rate.

14. The battery management system according to claim 13, wherein the swelling status is a thickness of the battery cell or a load acting on the battery cell.

15. The battery management system according to claim 13, wherein the control circuit is further configured to:
    determine that the battery cell is shorted internally if the first change amount is equal to or larger than a first pre-stored or predetermined threshold change amount, and a ratio of the second average change rate to the first average change rate is equal to or larger than a pre-stored or predetermined threshold ratio.

16. The battery management system of claim 13, wherein the control circuit is further configured to limit an allowable amount of a charge voltage, a discharge voltage, a charge current, or a discharge voltage if the battery cell is determined to be shorted internally.

17. A battery management method, comprising:
   detecting a swelling status of a battery cell to determine a first change amount, wherein the first change amount is a difference between a minimum swelling status and a maximum swelling status of a first time-series data during a charging procedure or a difference between the swelling status detected at a predetermined time after a start time of the charging procedure and the maximum swelling status of the first time-series data;
   generating first time-series data of the swelling status of the battery cell repeatedly detected during a charging procedure included in a charge/discharge cycle of the battery cell;
   determining a first average change rate of the swelling status in an early stage of the charging procedure and a second average change rate of the swelling status in a late stage of the charging procedure after the early stage from the first time-series data; and
   determining whether the battery cell is shorted internally based on the first change amount and a ratio of the second average change rate to the first average change rate.

18. The battery management method of claim 17, wherein the swelling status is a thickness of the battery cell or a load acting on the battery cell.

19. The battery management method of claim 17, further comprising:
   determining of whether the battery cell is shorted internally comprises determining that the battery cell is shorted internally if the first change amount is equal to or larger than a pre-stored or predetermined first threshold change amount, and a ratio of the second average change rate to the first average change rate is equal to or larger than a pre-stored or predetermined threshold ratio.

20. The battery management method of claim 17, further comprising:
   limiting an allowable amount of a charge voltage, a discharge voltage, a charge current, or a discharge voltage if the battery cell is determined to be shorted internally.

* * * * *